United States Patent
Shao et al.

(10) Patent No.: US 10,199,120 B2
(45) Date of Patent: Feb. 5, 2019

(54) SHIFT REGISTER AND DRIVING METHOD THEREOF, DRIVING CIRCUIT, ARRAY SUBSTRATE AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei (CN)

(72) Inventors: Xianjie Shao, Beijing (CN); Xiaohe Li, Beijing (CN)

(73) Assignees: BOE Technology Group Co., Ltd., Beijing (CN); Hefei BOE Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/526,380

(22) PCT Filed: Oct. 11, 2016

(86) PCT No.: PCT/CN2016/101748
§ 371 (c)(1),
(2) Date: May 12, 2017

(87) PCT Pub. No.: WO2017/177632
PCT Pub. Date: Oct. 19, 2017

(65) Prior Publication Data
US 2018/0174659 A1 Jun. 21, 2018

(30) Foreign Application Priority Data
Apr. 15, 2016 (CN) .......................... 2016 1 0231547

(51) Int. Cl.
*G11C 19/00* (2006.01)
*G11C 19/28* (2006.01)
*G09G 3/36* (2006.01)

(52) U.S. Cl.
CPC ............ *G11C 19/28* (2013.01); *G09G 3/3677* (2013.01); *G09G 3/3648* (2013.01); *G09G 2310/0286* (2013.01)

(58) Field of Classification Search
CPC ....... G09G 2310/0286; G09G 2310/08; G09G 2310/0267; G09G 3/3677; G11C 19/28
See application file for complete search history.

(56) References Cited

U.S. PATENT DOCUMENTS

2007/0296681 A1* 12/2007 Kim ..................... G11C 19/184
345/100
2015/0043704 A1 2/2015 Ma
(Continued)

FOREIGN PATENT DOCUMENTS

| CN | 101335050 A | 12/2008 |
| CN | 102867543 A | 1/2013 |

(Continued)

OTHER PUBLICATIONS

Written Opinion of the International Searching Authority from corresponding PCT Application No. PCT/CN2016/101748, dated Jan. 3, 2017 (6 pages).

*Primary Examiner* — Sibin Chen
(74) *Attorney, Agent, or Firm* — Harness, Dickey & Pierce, P.L.C.

(57) ABSTRACT

Embodiments of the present disclosure provide a shift register and a driving method thereof, a driving circuit, an array substrate, and a display device. The shift register comprises: a pull-up control sub-circuit, a pull-up sub-circuit, a pull-down control sub-circuit, a pull-down sub-circuit, a reset sub-circuit, a reverse sub-circuit and an output terminal. The pull-up control sub-circuit controls the pull-up for the electric level of the output terminal by the pull-up sub-circuit. The pull-down control sub-circuit controls the pull-down for the electric level of the output (Continued)

terminal by the pull-down sub-circuit. The reset sub-circuit resets the electric level of the output terminal. The reverse sub-circuit reverses the phase of the clock signal inputted to the pull-up sub-circuit. The circuit structure is simplified and can be applied to a narrow bezel or a screen with ultra-high resolution.

19 Claims, 5 Drawing Sheets

(56) References Cited

U.S. PATENT DOCUMENTS

| | | |
|---|---|---|
| 2016/0253975 A1 | 9/2016 | Yang et al. |
| 2017/0039969 A1 | 2/2017 | Wang |

FOREIGN PATENT DOCUMENTS

| | | |
|---|---|---|
| CN | 103426414 A | 12/2013 |
| CN | 104700769 A | 6/2015 |
| CN | 205050536 U | 2/2016 |
| CN | 105702297 A | 6/2016 |

* cited by examiner

SHIFT REGISTER AND DRIVING METHOD THEREOF, DRIVING CIRCUIT, ARRAY SUBSTRATE AND DISPLAY DEVICE

CROSS-REFERENCE TO RELATED APPLICATION

This patent application claims priority of Chinese Patent Application No. 201610231547.1, filed on Apr. 15, 2016, the entire content of which is incorporated by reference herein.

BACKGROUND

Embodiments of the present disclosure relate to a shift register and a driving method thereof, a driving circuit, an array substrate, and a display device A liquid crystal display employs a pixel array arranged with M*N points for displaying. Correspondingly, a Thin Film Transistor-Liquid Crystal Display (TFT-LCD) includes a gate driving circuit and a data driving circuit. The gate driving circuit outputs gate driving signals by shift registers to a plurality of gate lines of the pixel array, respectively, based on a clock signal.

In the gate driving circuit of the liquid crystal display, a plurality of shift registers operate in cascade, and a shift register at one stage is connected to one gate line for scanning the pixel array row by row. In the display panel, the gate driving circuit may employ an encapsulation manner of fixing a chip to a flexible circuit board (Chip On Flex, COF) or fixing a chip to a glass (Chip On Glass, COG), and also may use TFTs to constitute an integrated circuit unit so as to directly form a gate driving circuit in the display panel (Gate driver On Array, GOA).

BRIEF DESCRIPTION

Embodiments of the present disclosure provide a shift register and a driving method, a driving circuit, an array substrate, and a display device.

According to a first aspect, embodiments of the present disclosure provide a shift register including: a pull-up control sub-circuit, a pull-up sub-circuit, a pull-down control sub-circuit, a pull-down sub-circuit, a reset sub-circuit, a reverse sub-circuit and an output terminal. The pull-up control sub-circuit is connected to the pull-up sub-circuit and the pull-up control sub-circuit is configured to control the pull-up for the electric level of the output terminal by the pull-up sub-circuit. The pull-up sub-circuit is connected to the output terminal and the pull-up sub-circuit is configured to pull up the electric level of the output terminal. The pull-down control sub-circuit is connected to the pull-down sub-circuit and the pull-down control sub-circuit is configured to control the pull-down for the electric level of the output terminal by the pull-down sub-circuit. The pull-down sub-circuit is connected to the output terminal and the pull-down sub-circuit is configured to pull down the electric level of the output terminal. The reset sub-circuit is connected to the output terminal and the reset sub-circuit is configured to reset the electric level of the output terminal. The reverse sub-circuit is connected to the pull-up sub-circuit and the reverse sub-circuit is configured to reverse the phase of the clock signal inputted to the pull-up sub-circuit.

In embodiments of the present disclosure, the reverse sub-circuit includes a control terminal, a first terminal, a second terminal, and a third terminal. The control terminal of the reverse sub-circuit is connected to the clock signal terminal, the first terminal of the reverse sub-circuit is connected to the first voltage terminal, the second terminal of the reverse sub-circuit is connected to the second voltage terminal, and the third terminal of the reverse sub-circuit is connected to the pull-up sub-circuit.

In embodiments of the present disclosure, the reverse sub-circuit includes a ninth transistor and a tenth transistor, the control terminal of the ninth transistor is the control terminal of the reverse sub-circuit, the first terminal of the ninth transistor is the first terminal of the reverse sub-circuit, and the second terminal of the ninth transistor is the third terminal of the reverse sub-circuit. The connection point connecting the control terminal and first terminal of the tenth transistor is the second terminal of the reverse sub-circuit, and the second terminal of the tenth transistor is connected to the second terminal of the ninth transistor.

In embodiments of the present disclosure, the pull-up control sub-circuit includes a control terminal, a first terminal and a second terminal. The pull-up sub-circuit includes a control terminal, a first terminal and a second terminal. The pull-down control sub-circuit includes a control terminal, a first terminal, a second terminal and a third terminal. The pull-down sub-circuit includes a control terminal, a first terminal, a second terminal and a third terminal. The reset sub-circuit includes a control terminal, a first terminal, a second terminal and a third terminal. The control terminal and first terminal of the pull-up control sub-circuit are connected to the input terminal, and the second terminal of the pull-up control sub-circuit is connected to the control terminal of the pull-up sub-circuit. The first terminal of the pull-up sub-circuit is connected to the third terminal of the reverse sub-circuit, and the second terminal of the pull-up sub-circuit is connected to the output terminal. The control terminal of the pull-down control sub-circuit is connected to the second terminal of the pull-up control sub-circuit, the first terminal of the pull-down control sub-circuit is connected to the first voltage terminal, the second terminal of the pull-down control sub-circuit is connected to the second voltage terminal, and the third terminal of the pull-down control sub-circuit is connected to the control terminal of the pull-down sub-circuit. The first terminal of the pull-down sub-circuit is connected to the first voltage terminal, the second terminal of the pull-down sub-circuit is connected to the control terminal of the pull-up sub-circuit, and the third terminal of the pull-down sub-circuit is connected to the output terminal. The control terminal of the reset sub-circuit is connected to the reset terminal, the first terminal of the reset sub-circuit is connected to the first voltage terminal, the second terminal of the reset sub-circuit is connected to the control terminal of the pull-up sub-circuit, and the third terminal of the reset sub-circuit is connected to the output terminal.

In embodiments of the present disclosure, the pull-up control sub-circuit includes a first transistor. The control terminal of the first transistor is the control terminal of the pull-up control sub-circuit, the first terminal of the first transistor is the first terminal of the pull-up control sub-circuit, and the second terminal of the first transistor is the second terminal of the pull-up control sub-circuit.

In embodiments of the present disclosure, the pull-up sub-circuit includes a second transistor and a first capacitor. The control terminal of the second transistor is the control terminal of the pull-up sub-circuit, the first terminal of the second transistor is the first terminal of the pull-up sub-circuit, and the second terminal of the second transistor is the second terminal of the pull-up sub-circuit. The first capacitor is connected between the control terminal and second terminal of the second transistor.

In embodiments of the present disclosure, the pull-down control sub-circuit includes a third transistor and a fourth transistor. The control terminal of the third transistor is the control terminal of the pull-down control sub-circuit, the first terminal of the third transistor is the first terminal of the pull-down control sub-circuit, the second terminal of the third transistor is the third terminal of the pull-down control sub-circuit, and the connection point connecting the control terminal and first terminal of the fourth transistor is the second terminal of the pull-down control sub-circuit; the second terminal of the fourth transistor is connected to the second terminal of the third transistor.

In embodiments of the present disclosure, the pull-down sub-circuit includes a fifth transistor and a sixth transistor. The connection point connecting the control terminal of the fifth transistor and the control terminal of the sixth transistor is the control terminal of the pull-down sub-circuit, the connection point connecting the first terminal of the fifth transistor and the first terminal of the sixth transistor is the first terminal of the pull-down sub-circuit. The second terminal of the fifth transistor is the second terminal of the pull-down sub-circuit. The second terminal of the sixth transistor is the third terminal of the pull-down sub-circuit.

In embodiments of the present disclosure, the reset sub-circuit includes a seventh transistor and an eighth transistor. The connection point connecting the control terminal of the seventh transistor and the control terminal of the eighth transistor is the control terminal of the reset sub-circuit, and the connection point connecting the first terminal of the seventh transistor and the first terminal of the eighth transistor is the first terminal of the reset sub-circuit. The second terminal of the seventh transistor is the second terminal of the reset sub-circuit. The second terminal of the eighth transistor is the third terminal of the reset sub-circuit.

According to a second aspect, embodiments of the present disclosure provide a gate driving circuit including a plurality of first shift registers and a plurality of second shift registers, wherein the first shift registers and the second shift registers are connected in cascade. The first shift register includes a pull-up control sub-circuit, a pull-up sub-circuit, a pull-down control sub-circuit, a pull-down sub-circuit, a reset sub-circuit and an output terminal. The second shift register includes a pull-up control sub-circuit, a pull-up sub-circuit, a pull-down control sub-circuit, a pull-down sub-circuit, a reset sub-circuit, a reverse sub-circuit and an output terminal. The pull-up control sub-circuit is connected to the pull-up sub-circuit and the pull-up control sub-circuit is configured to control the pull-up for the electric level of the output terminal by the pull-up sub-circuit. The pull-up sub-circuit is connected to the output terminal and the pull-up sub-circuit is configured to pull up the electric level of the output terminal. The pull-down control sub-circuit is connected to the pull-down sub-circuit and the pull-down control sub-circuit is configured to control the pull-down for the electric level of the output terminal by the pull-down sub-circuit. The pull-down sub-circuit is connected to the output terminal and the pull-down sub-circuit is configured to pull down the electric level of the output terminal. The reset sub-circuit is connected to the output terminal and the reset sub-circuit is configured to reset the electric level of the output terminal. The reverse sub-circuit is connected to the pull-up sub-circuit and is configured to reverse the phase of the clock signal inputted to the pull-up sub-circuit. The output terminal is configured to provide a gate driving signal to a pixel circuit. The output terminal of the shift register at one stage is connected to the pull-up control sub-circuit of the shift register at the next stage, and the output terminal of the shift register at one stage is connected to the reset sub-circuit of the shift register at the previous stage. Wherein the plurality of first shift registers and the plurality of second shift registers are provided with the same clock signal.

According to a third aspect, embodiments of the present disclosure provide an array substrate including the gate driving circuit described above.

According to a fourth aspect, embodiments of the present disclosure provide a display device including the array substrate described above.

According to a fifth aspect, embodiments of the present disclosure provide a driving method for a shift register to drive the shift register described above, including: reversing the phase of the clock signal inputted to the pull-up sub-circuit using the reverse sub-circuit.

The shift register and the driving method thereof, the driving circuit, the array substrate, and the display device according to embodiments of the present disclosure, simplify the circuit structure and can realize a narrow bezel or a screen with ultra-high resolution.

BRIEF DESCRIPTION OF THE DRAWINGS

In order to more clearly illustrate the technical solutions of embodiments of the present disclosure, the drawings of the embodiments will be briefly described below. It should be understood that the drawings described below merely relate to some embodiments of the present disclosure rather than limiting the present disclosure, in which.

DETAILED DESCRIPTION

To make the technical solutions and advantages of embodiments of the present disclosure more clear, the technical solutions of the embodiments of the present disclosure will be clearly and completely described below in conjunction with the drawings. Obviously, the embodiments described are part of embodiments of the present disclosure, instead of all the embodiments. Based on the described embodiments of the present disclosure, all other embodiments obtained by those skilled in the art without creative work also fall within the scope of protection sought for by the present disclosure.

Figure 1:
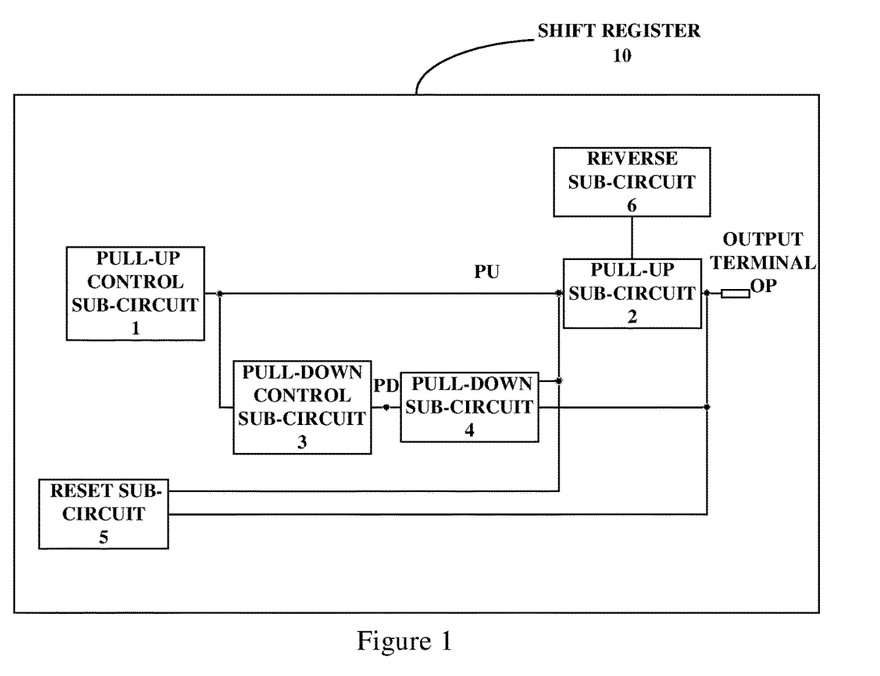
FIG. 1 is a block diagram showing the structure of a shift register provided according to an embodiment of the present disclosure.

FIG. 1 is a block diagram showing the structure of a shift register provided according to an embodiment of the present disclosure. In embodiments of the present disclosure, the shift register 10 includes a pull-up control sub-circuit 1, a pull-up sub-circuit 2, a pull-down control sub-circuit 3, a pull-down sub-circuit 4, a reset sub-circuit 5, a reverse sub-circuit 6, and an output terminal OP. The pull-up control sub-circuit 1 is connected to the pull-up sub-circuit 2, and the pull-up control sub-circuit 1 is configured to control the pull-up for the electric level of the output terminal OP by the pull-up sub-circuit 2. The pull-up sub-circuit 2 is connected to the output terminal OP, and the pull-up sub-circuit 2 is configured to pull up the electric level of the output terminal OP. The pull-down control sub-circuit 3 is connected to the pull-down sub-circuit 4, and the pull-down control sub-circuit 3 is configured to control the pull-down for the electric level of the output terminal OP by the pull-down sub-circuit 4. The pull-down sub-circuit 4 is connected to the output terminal OP, and the pull-down sub-circuit 4 is configured to pull down the electric level of the output terminal OP. The reset sub-circuit 5 is connected to the output terminal OP, and the reset sub-circuit 5 is configured to reset the electric level of the output terminal OP. The reverse sub-circuit 6 is connected to the pull-up sub-circuit 2, and the reverse sub-circuit 6 is configured to reverse the phase of a clock signal inputted to the pull-up sub-circuit 2. PU represents the pull-up node connecting the pull-up control sub-circuit 1 and the pull-up sub-circuit 2. PD represents the pull-down node PD connecting the pull-down control sub-circuit 3 and the pull-down sub-circuit 4.

With the addition of the reverse sub-circuit 6, the clock signal can be adjusted in the shift register 10 without the need to add a clock signal source or a clock signal adjustment circuit externally.

Figure 2:
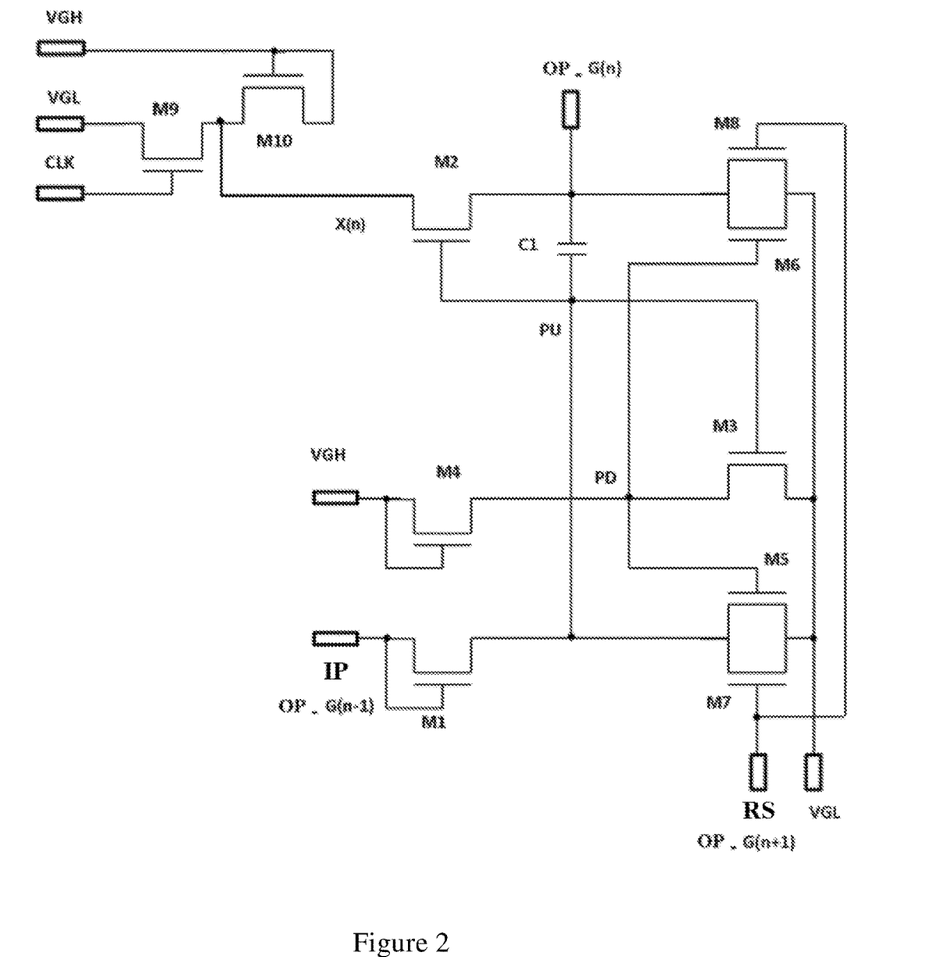
FIG. 2 is a schematic circuit diagram of the shift register shown in FIG. 1.

FIG. 2 is a schematic circuit diagram of the shift register shown in FIG. 1. In embodiments of the present disclosure, the pull-up control sub-circuit 1 includes a control terminal, a first terminal and a second terminal. The pull-up sub-circuit 2 includes a control terminal, a first terminal and a second terminal. The pull-down control sub-circuit 3 includes a control terminal, a first terminal, a second terminal and a third terminal. The pull-down sub-circuit 4 includes a control terminal, a first terminal, a second terminal and a third terminal. The reset sub-circuit 5 includes a control terminal, a first terminal, a second terminal and a third terminal. The reverse sub-circuit 6 includes a control terminal, a first terminal, a second terminal and a third terminal. The control terminal and first terminal of the pull-up control sub-circuit 1 are connected to an input terminal IP, and the second terminal of the pull-up control sub-circuit 1 is connected to the control terminal of the pull-up sub-circuit 2. The first terminal of the pull-up sub-circuit 2 is connected to the third terminal of the reverse sub-circuit 6 and the second terminal of the pull-up sub-circuit 2 is connected to the output terminal OP. The control terminal of the pull-down control sub-circuit 3 is connected to the second terminal of the pull-up control sub-circuit 1, the first terminal of the pull-down control sub-circuit 3 is connected to a first voltage terminal VGL, the second terminal of the pull-down control sub-circuit 3 is connected to a second voltage terminal VGH, and the third terminal of the pull-down control sub-circuit 3 is connected to the control terminal of the pull-down sub-circuit 4. The first terminal of the pull-down sub-circuit 4 is connected to the first voltage terminal VGL, the second terminal of the pull-down sub-circuit 4 is connected to the control terminal of the pull-up sub-circuit 2, and the third terminal of the pull-down sub-circuit 4 is connected to the output terminal OP. The control terminal of the reset sub-circuit 5 is connected to a reset terminal RS, the first terminal of the reset sub-circuit 5 is connected to the first voltage terminal VGL, the second terminal of the reset sub-circuit 5 is connected to the control terminal of the pull-up sub-circuit 2, and the third terminal of the reset sub-circuit 5 is connected to the output terminal OP. The control terminal of the reverse sub-circuit 6 is connected to a clock signal terminal CLK, the first terminal of the reverse sub-circuit 6 is connected to the first voltage terminal VGL, and the second terminal of the reverse sub-circuit 6 is connected to the second voltage terminal VGH.

In embodiments of the present disclosure, the pull-up control sub-circuit 1 includes a first transistor M1. The control terminal of the first transistor M1 is the control terminal of the pull-up control sub-circuit 1, the first terminal of the first transistor M1 is the first terminal of the pull-up control sub-circuit 1, and the second terminal of the first transistor M1 is the second terminal of the pull-up control sub-circuit 1.

The pull-up sub-circuit 2 includes a second transistor M2 and a first capacitor C1. The control terminal of the second transistor M2 is the control terminal of the pull-up sub-circuit 2, the first terminal of the second transistor M2 is the first terminal of the pull-up sub-circuit 2, and the second terminal of the second transistor M2 is the second terminal of the pull-up sub-circuit 2. The first capacitor C1 is connected between the control terminal and the second terminal of the second transistor M2.

The pull-down control sub-circuit 3 includes a third transistor M3 and a fourth transistor M4. The control terminal of the third transistor M3 is the control terminal of the pull-down control sub-circuit 3, the first terminal of the third transistor M3 is the first terminal of the pull-down control sub-circuit 3, the second terminal of the third transistor M3 is the third terminal of the pull-down control sub-circuit 3, and the connection point connecting the control terminal and first terminal of the fourth transistor M4 is the second terminal of the third transistor M3; and the second terminal of the fourth transistor M4 is connected to the second terminal of the third transistor M3.

The pull-down sub-circuit 4 includes a fifth transistor M5 and a sixth transistor M6. The connection point connecting the control terminal of the fifth transistor M5 and the control terminal of the sixth transistor M6 is the control terminal of the pull-down sub-circuit 4, the connection point connecting the first terminal of the fifth transistor M5 and the first terminal of the sixth transistor M6 is the first terminal of the pull-down sub-circuit 4. The second terminal of the fifth transistor M5 is the second terminal of the pull-down sub-circuit 4. The second terminal of the sixth transistor M6 is the third terminal of the pull-down sub-circuit 4.

The reset sub-circuit 5 includes a seventh transistor M7 and an eighth transistor M8. The connection point connecting the control terminal of the seventh transistor M7 and the control terminal of the eighth transistor M8 is the control terminal of the reset sub-circuit 5, and the connection point connecting the first terminal of the seventh transistor M7 and the first terminal of the eighth transistor M8 is the first terminal of the reset sub-circuit 5. The second terminal of the seventh transistor M7 is the second terminal of the reset sub-circuit 5. The second terminal of the eighth transistor M8 is the third terminal of the reset sub-circuit 5.

The reverse sub-circuit 6 includes a ninth transistor M9 and a tenth transistor M10, the control terminal of the ninth transistor M9 is the control terminal of the reverse sub-circuit 6, the first terminal of the ninth transistor M9 is the first terminal of the reverse sub-circuit 6 and the second terminal of the ninth transistor M9 is the third terminal of the reverse sub-circuit 6. The connection point connecting the control terminal and first terminal of the tenth transistor M10 is the second terminal of the reverse sub-circuit 6, and the second terminal of the tenth transistor M10 is connected to the second terminal of the ninth transistor M9.

In the reverse sub-circuit 6, the ninth transistor M9 and the tenth transistor M10 constitute a reverser which reverses the clock signal. The structure is simple, and the reversed signal is derived from the first voltage terminal VGL and the second voltage terminal VGH, with good signal stability.

In the pull-down control sub-circuit 3, the third transistor M3 and the fourth transistor M4 constitute a reverser so that the pull-down control sub-circuit 3 outputs a control signal with stable state to the pull-down sub-circuit 4, so as to prevent the pull-down sub-circuit 4 from malfunctioning.

Figure 3:
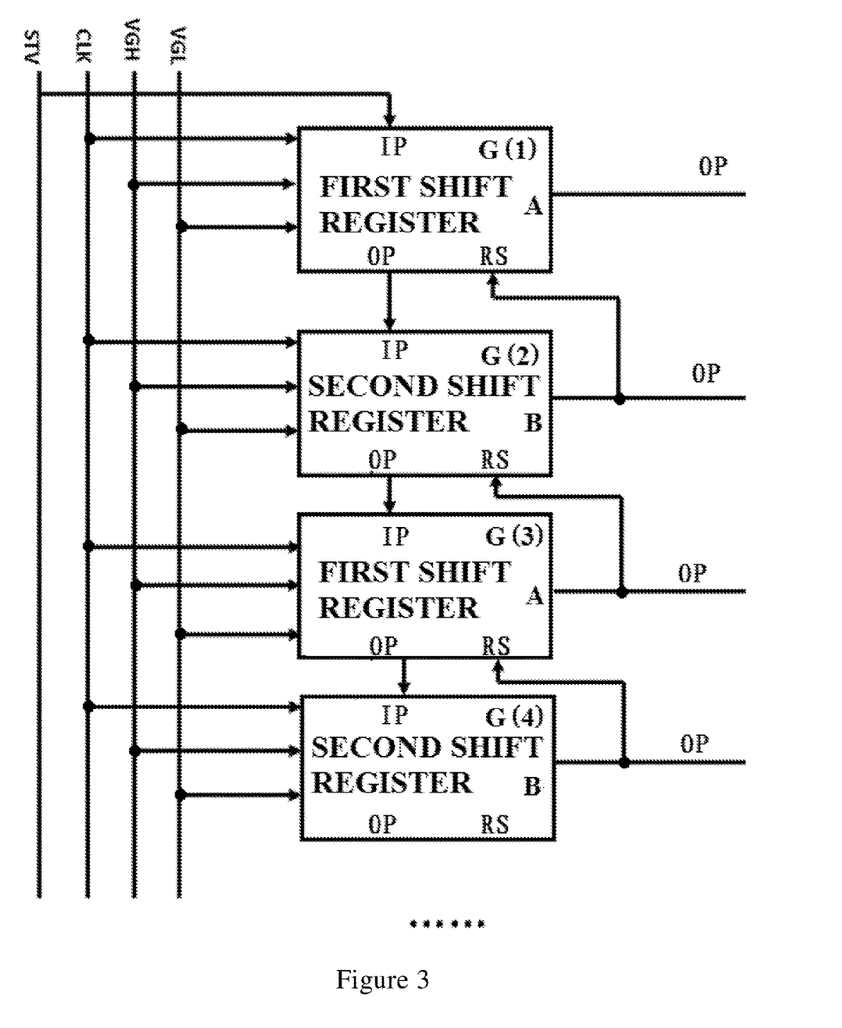
FIG. 3 is a block diagram showing the structure of a gate driving circuit provided according to another embodiment of the present disclosure.

FIG. 3 is a block diagram showing the structure of a gate driving circuit provided according to another embodiment of the present disclosure.

In embodiments of the present disclosure, there is provided a gate driving circuit including a plurality of first shift register A and a plurality of second shift registers B, and the first shift register A and the second shift register B are connected in cascade. The first shift register A includes a pull-up control sub-circuit 1, a pull-up sub-circuit 2, a pull-down control sub-circuit 3, a pull-down sub-circuit 4, a reset sub-circuit 5 and an output terminal OP. The second shift register B includes a pull-up control sub-circuit 1, a pull-up sub-circuit 2, a pull-down control sub-circuit 3, a pull-down sub-circuit 4, a reset sub-circuit 5, a reverse sub-circuit 6, and an output terminal OP. The pull-up control sub-circuit 1 is connected to the pull-up sub-circuit 2, and the pull-up control sub-circuit 1 is configured to control the pull-up for the electric level of the output terminal OP by the pull-up sub-circuit 2. The pull-up sub-circuit 2 is connected to the output terminal OP, and the pull-up sub-circuit 2 is configured to pull up the electric level of the output terminal OP. The pull-down control sub-circuit 3 is connected to the pull-down sub-circuit 4, and the pull-down control sub-circuit 3 is configured to control the pull-down for the pull-down sub-circuit 4 for the electric level of the output terminal OP. The pull-down sub-circuit 4 is connected to the output terminal OP, and the pull-down sub-circuit 4 is configured to pull down the electric level of the output terminal OP. The reset sub-circuit 5 is connected to the output terminal OP, and the reset sub-circuit 5 is configured to reset the electric level of the output terminal OP. The reverse sub-circuit 6 is connected to the pull-up sub-circuit 2 and is configured to reverse the phase of the clock signal inputted to the pull-up sub-circuit 2. The output terminal OP is configured to provide a gate driving signal to the pixel circuit. The output terminal OP of a shift register at one stage is connected to the pull-up control sub-circuit 1 of the shift register at the next stage, and the output terminal OP of a shift register at one stage is connected to the reset sub-circuit 5 of the shift register at the previous stage. Wherein the plurality of first shift registers A and the plurality of second shift registers B are provided with the same clock signal which is provided by the clock signal terminal CLK.

With the addition of the reverse sub-circuit 6 in the second shift register B, the clock signal can be adjusted in the shift register without the need to add a clock signal source or clock signal adjustment circuit externally. In embodiments of the present disclosure, a liquid crystal display gate driving circuit that can be driven using only a single clock signal terminal CLK is implemented in a simple manner.

Figure 4:
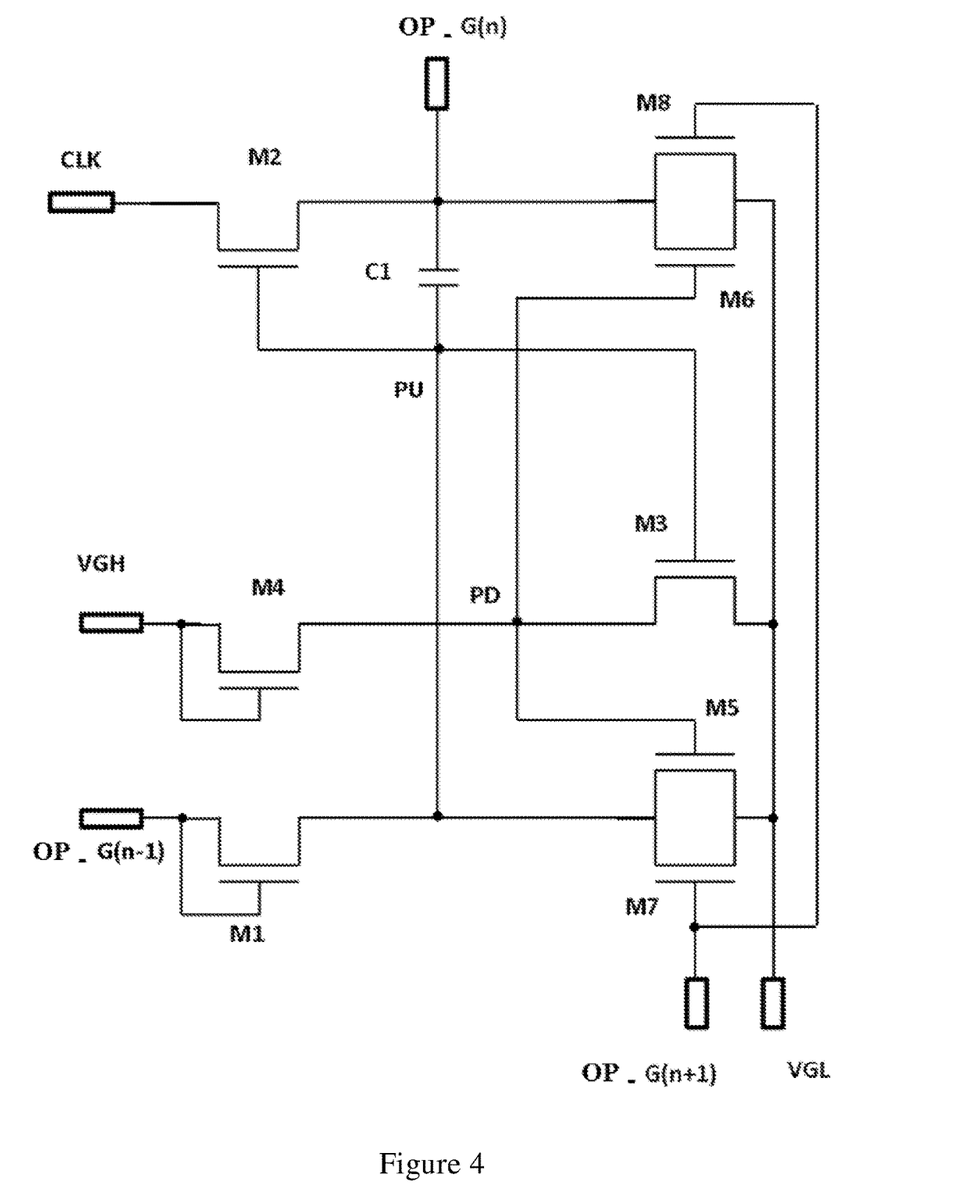
FIG. 4 is a schematic circuit diagram of the first shift register in FIG. 3.

FIG. 4 is a schematic circuit diagram of the first shift register in FIG. 3. In embodiments of the present disclosure, the first shift register may have the same structure as the second shift register B except that the reverse sub-circuit 6 is not included. In this way, the circuit structure is further simplified.

According to still another embodiment of the present disclosure, there is provided an array substrate including the gate driving circuit described above.

According to still another embodiment of the present disclosure, there is provided a display device including the above-described array substrate. The display device may be any product or component having a display function such as a liquid crystal panel, an electronic paper, an OLED panel, a mobile phone, a tablet computer, a television set, a monitor, a notebook computer, a digital photo frame, a navigator, or the like.

Figure 5:
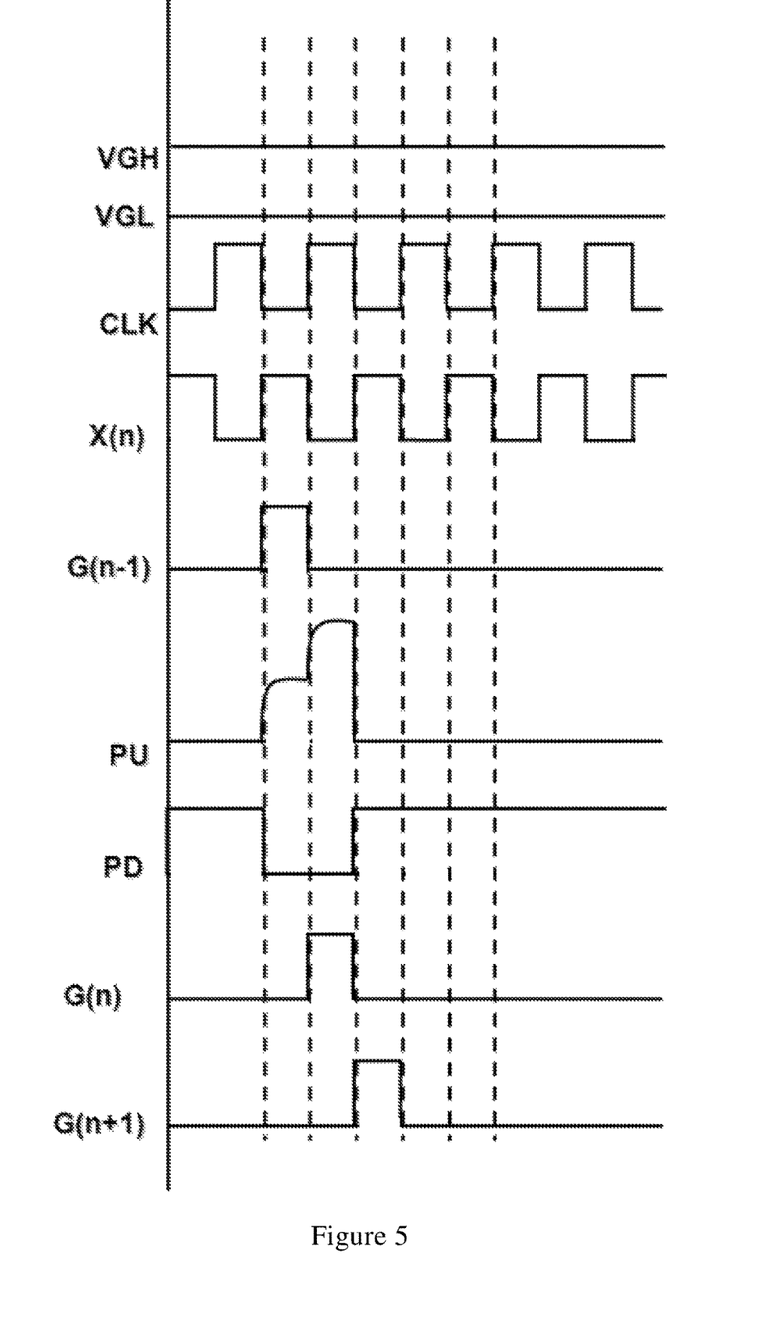
FIG. 5 is a schematic timing chart of the shift register shown in FIG. 3.

FIG. 5 is a schematic timing chart of the shift register shown in FIG. 3. According to still another embodiment of the present disclosure, there is provided a driving method for a shift register to drive the shift register described above. Herein, the description will be given by example of the first shift register A and the second shift register B cascaded therewith shown in FIG. 2, and by example of the first shift register A as the shift register G (n) at the n-th stage and the second shift register B as the shift register G (n+1) at the n+1-th stage, wherein n is any natural number.

The driving method includes: a first period which is a pull-up preparation period; a second period which is a pull-up period; a third period which is a reset period; and a fourth period which is a pull-down period.

In the first period which is a pull-up preparation period, the pull-up control sub-circuit 1 is turned on, the pull-up sub-circuit 2 is turned on, the pull-down control sub-circuit 3 is turned on, the pull-down sub-circuit 4 is turned off, and the reset sub-circuit 5 is turned off. The output terminal OP outputs a low electric level.

In the first period, the voltage of the input terminal IP of the first shift register A at the n-th stage (i.e., the output terminal OP_G (n−1) of the shift register at the n−1-th stage) is at a high electric level so that the first transistor M1 is turned on.

Here, the description is given by example of the transistor being an N-type transistor, and the transistor is turned on when a high electric level voltage is applied to the control terminal of the transistor. Correspondingly, the voltage of the first voltage terminal VGL is at a low electric level and the voltage of the second voltage terminal VGH is at a high electric level.

Since the transistors in the present embodiment are switching transistors that operate as switches, it is also possible to use a P-type transistor, in which case the circuit structure need not be changed, and it is only necessary to change the electric level of the voltage applied to the control terminal of the transistor to implement exactly the same function.

In the first shift register A at the n-th stage, the high electric level voltage of the input terminal IP charges the first capacitor C1 so that the electric level of the pull-up node PU is pulled up. At this time, the voltage of the clock signal terminal CLK is at a low electric level, and even if the second transistor M2 is turned on, the voltage of the output terminal OP is still at a low electric level. Since the high electric level of the pull-up node PU also cause the sixth transistor M3 to be turned on so that the voltage of the pull-down node PD is at a low electric level, the fifth transistor M5 and the sixth transistor M6 are turned off, so as not to pull down the output terminal OP, thereby ensuring a stable output when the output terminal OP outputs a high electric level signal at the next period.

In the second period which is a pull-up period, the pull-up control sub-circuit 1 is turned off, the pull-up sub-circuit 2 is turned on, the pull-down control sub-circuit 3 is turned on, the pull-down sub-circuit 4 is turned off and the reset sub-circuit 5 is turned off. The output terminal OP outputs a high electric level.

In the second period, the voltage of the input terminal IP of the first shift register A at the n-th stage is at a low electric level, the first transistor M1 is turned off, the pull-up node PU remains at a high electric level, and the second transistor M2 remains in the ON state. At this time, the voltage of the clock signal input terminal CLK is at a high electric level, the voltage of the output terminal OP is at a high electric level, and due to the bootstrapping of the first capacitor C1, the voltage of the pull-up node PU is further increased to ensure that the second transistor M2 is turned on stably and finally transmits a driving signal to the output terminal OP. The pull-up node PU is at a high electric level, and the third transistor M3 is still in the ON state to discharge the pull-down node PD so that the fifth transistor M5 and the sixth transistor M6 continue to be turned off to ensure the driving signal of the output terminal OP is outputted stably and will not be pulled down.

At the same time, the second shift register B at the n+1-th stage enters the first period, and its input terminal IP receives the high electric level voltage outputted by the output terminal OP_G (n) of the first shift register A at the n-th stage. In the second shift register B at the n+1-th stage, the first transistor M1 is turned on. The high electric level voltage of the input terminal IP charges the first capacitor C1 so that the voltage of the pull-up node PU is pulled up. At the time the voltage of the clock signal terminal CLK is at a high electric level, and due to the function of the ninth transistor M9 and tenth transistor M10 in the reverse sub-circuit 6, the voltage of the third terminal X (n) of the reverse sub-circuit 6 is at a low electric level. The second transistor M2 is turned on, but the voltage of the output terminal OP is still at a low electric level. At the same time, since the voltage of the pull-up node PU is at a high electric level to turn on the third transistor M3 so that the electric level of the pull-down node PD in this period is low and the fifth transistor M5 and the sixth transistor M6 are turned off to ensure a stable output of the output terminal OP.

In the third period which is a reset period, the pull-up control sub-circuit 1 is turned off, the pull-up sub-circuit 2 is turned off, the pull-down control sub-circuit 3 is turned off, the pull-down sub-circuit 4 is turned on and the reset sub-circuit 5 is turned on. The output terminal OP outputs a low electric level;

The second shift register B at the n+1-th stage enters the second period, the pull-up node PU remains at a high electric level, and the second transistor M2 remains in the ON state. At this time, the voltage of the clock input terminal CLK is at a low electric level, and due to the function of the ninth transistor M9 and tenth transistor M10 in the reverse sub-circuit 6, the voltage of the third terminal X (n) of the reverse sub-circuit 6 is at a high electric level. The voltage of the output terminal OP is at a high electric level, and due to the bootstrapping of the first capacitor C1, the voltage of the pull-up node PU is further increased to ensure that the second transistor M2 is turned on stably to finally transmit a driving signal to the output terminal OP. The pull-up node PU is at a high electric level, the third transistor M3 is still in the ON state to discharge the pull-down node PD so that the fifth transistor M5 and the sixth transistor M6 remain Off to ensure that the driving signal of the output terminal OP is outputted stably and will not be pulled down. That is, the voltage of the output terminal OP (OP_G (n+1)) of the second shift register B at the n+1-th stage is at a high electric level.

Since the reset terminal RS of the first shift register A at the n-th stage is connected to the output terminal OP of the second shift register B at the n+1-th stage, the seventh transistor M7 and the eighth transistor M8 of the reset sub-circuit 5 are turned on to reset the pull-up node PU and the output terminal OP. The voltage of the output terminal OP of the first shift register A at the n-th stage is at a low electric level.

In the fourth period which is a pull-down period, the pull-up control sub-circuit 1 is turned off, the pull-up sub-circuit 2 is turned off, the pull-down control sub-circuit 3 is turned off, the pull-down sub-circuit 4 is turned on and the reset sub-circuit 5 is turned off. The output terminal OP outputs a low electric level.

After the first shift register A at the n-th stage is reset, the voltage of the pull-up node PU is at a low electric level, the third transistor M3 of the pull-down control sub-circuit 3 is turned off, the fourth transistor M4 is turned on, and the high electric level voltage of the second voltage terminal VGH is applied to the pull-down node PD. The voltage of the pull-down node PD is maintained at a high electric level, and the fifth transistor M5 and the sixth transistor M6 of the pull-down sub-circuit 4 are turned on to continuously pull down the pull-up node PU and the output terminal OP.

The continuous pull-down causes the coupling noise voltage generated by the clock signal of the clock signal terminal CLK to be eliminated, thus ensuring a stable output of the low electric level voltage to ensure the stability of the signal output. According to the above method, in the shift register at one stage, as long as the voltage of the pull-up node PU is at a high electric level, the voltage of the pull-down node PD is at a low electric level. As long as the voltage of the pull-up PU is at a low electric level, the voltage of the pull-down node PD is always at a high electric level, and the fifth transistor M5 and the sixth transistor M6 of the pull-down sub-circuit 4 are always turned on, to pull down the pull-up node PU and the output terminal OP to remove the noise voltage.

The pull-down state continues until the next frame arrives. When the next frame is scanned, a high electric level voltage is applied to the input terminal IP and the shift register restarts the first period.

According to an embodiment of the present disclosure, the function of the gate shift register is realized by a single clock signal terminal CLK. The addition of the ninth transistor M9 and the tenth transistor M10 in the reverse sub-circuit 6 causes the phase of the clock signal to be reversed, whereby the second clock signal required in the conventional GOA circuit is replaced.

According to an embodiment of the present disclosure, it can be applied to a liquid crystal display to provide a low-noise and high-reliability gate scan driving circuit.

It should be noted that, in the above description, a high electric level and a low electric level are only used to distinguish whether the voltage can turn on the transistor, indicate the logic levels or complete other functions, and there is no limit to the value of voltage. For example, a low electric level may refer to a ground electric level and also may be a negative electric level. According to the principles of the present disclosure, those skilled in the art can make appropriate selections and adjustments of the types of the transistors without the need for creative work, and these selections and adjustments are also considered to be within the scope of protection sought for by the present disclosure.

It may be understood that the above embodiments are merely exemplary embodiments for the purpose of illustrating the principles of the present disclosure, but the present disclosure is not limited thereto. Those of ordinary skill in the art may make various modifications and improvements without departing from the spirit and essence of the present disclosure, which are also considered to be within the scope of protection sought for by the present disclosure.

What is claimed is:

1. A shift register comprising:
a pull-up control sub-circuit;
a pull-up sub-circuit;
a pull-down control sub-circuit;
a pull-down sub-circuit;
a reset sub-circuit;
a reverse sub-circuit; and
an output terminal;
wherein the pull-up control sub-circuit is connected to the pull-up sub-circuit, and configured to control a pull-up of an electric level of the output terminal by the pull-up sub-circuit;
wherein the pull-up sub-circuit is connected to the output terminal, and configured to pull up the electric level of the output terminal;
wherein the pull-down control sub-circuit is connected to the pull-down sub-circuit, and configured to control a pull-down of the electric level of the output terminal by the pull-down sub-circuit;
wherein the pull-down sub-circuit is connected to the output terminal, and configured to pull down the electric level of the output terminal;
wherein the reset sub-circuit is connected to the output terminal, and configured to reset the electric level of the output terminal;
wherein the reverse sub-circuit includes a control terminal, a first terminal, a second terminal, and a third terminal; and
wherein the control terminal of the reverse sub-circuit is connected to a clock signal terminal, the first terminal of the reverse sub-circuit is connected to a first voltage terminal, the second terminal of the reverse sub-circuit is connected to a second voltage terminal, the third terminal of the reverse sub-circuit is connected to the pull-up sub-circuit, and a phase of a signal output to the pull-up sub-circuit by the third terminal of the reverse sub-circuit is opposite to a phase of a clock signal received from the clock signal terminal at the control terminal of the reverse sub-circuit.

2. The shift register according to claim 1,
wherein the reverse sub-circuit includes a ninth transistor and a tenth transistor;
wherein a control terminal of the ninth transistor is the control terminal of the reverse sub-circuit, a first terminal of the ninth transistor is the first terminal of the reverse sub-circuit, and a second terminal of the ninth transistor is the third terminal of the reverse sub-circuit; and
wherein a connection point connecting a control terminal and a first terminal of the tenth transistor is the second terminal of the reverse sub-circuit, and a second terminal of the tenth transistor is connected to the second terminal of the ninth transistor.

3. The shift register according to claim 1,
wherein the pull-up control sub-circuit includes a control terminal, a first terminal and a second terminal;
wherein the pull-up sub-circuit includes a control terminal, a first terminal and a second terminal;
wherein the pull-down control sub-circuit includes a control terminal, a first terminal, a second terminal and a third terminal;
wherein the pull-down sub-circuit includes a control terminal, a first terminal, a second terminal and a third terminal;
wherein the reset sub-circuit includes a control terminal, a first terminal, a second terminal and a third terminal;
wherein the control terminal and the first terminal of the pull-up control sub-circuit are connected to an input terminal, and the second terminal of the pull-up control sub-circuit is connected to the control terminal of the pull-up sub-circuit;
wherein the first terminal of the pull-up sub-circuit is connected to the third terminal of the reverse sub-circuit, and the second terminal of the pull-up sub-circuit is connected to the output terminal;
wherein the control terminal of the pull-down control sub-circuit is connected to the second terminal of the pull-up control sub-circuit, the first terminal of the pull-down control sub-circuit is connected to the first voltage terminal, the second terminal of the pull-down control sub-circuit is connected to the second voltage terminal, and the third terminal of the pull-down control sub-circuit is connected to the control terminal of the pull-down sub-circuit;
wherein the first terminal of the pull-down sub-circuit is connected to the first voltage terminal, the second terminal of the pull-down sub-circuit is connected to the control terminal of the pull-up sub-circuit, and the third terminal of the pull-down sub-circuit is connected to the output terminal; and
wherein the control terminal of the reset sub-circuit is connected to a reset terminal, the first terminal of the reset sub-circuit is connected to the first voltage terminal, the second terminal of the reset sub-circuit is connected to the control terminal of the pull-up sub-circuit, and the third terminal of the reset sub-circuit is connected to the output terminal.

4. The shift register according to claim 3,
wherein the pull-up control sub-circuit includes a first transistor; and
wherein a control terminal of the first transistor is the control terminal of the pull-up control sub-circuit, a first terminal of the first transistor is the first terminal of the pull-up control sub-circuit, and a second terminal of the first transistor is the second terminal of the pull-up control sub-circuit.

5. The shift register according to claim 4,
wherein the pull-up sub-circuit includes a second transistor and a first capacitor;
wherein a control terminal of the second transistor is the control terminal of the pull-up sub-circuit, a first terminal of the second transistor is the first terminal of the pull-up sub-circuit, and a second terminal of the second transistor is the second terminal of the pull-up sub-circuit; and
wherein the first capacitor is connected between the control terminal and the second terminal of the second transistor.

6. The shift register according to claim 4,
wherein the pull-down control sub-circuit includes a third transistor and a fourth transistor;
wherein a control terminal of the third transistor is the control terminal of the pull-down control sub-circuit, a first terminal of the third transistor is the first terminal of the pull-down control sub-circuit, and a second terminal of the third transistor is the third terminal of the pull-down control sub-circuit; and wherein a connection point connecting a control terminal and a first terminal of the fourth transistor is the second terminal of the pull-down control sub-circuit, and a second terminal of the fourth transistor is connected to the second terminal of the third transistor.

7. The shift register according to claim 4,
wherein the pull-down sub-circuit includes a fifth transistor and a sixth transistor;
wherein a connection point connecting a control terminal of the fifth transistor and a control terminal of the sixth transistor is the control terminal of the pull-down sub-circuit, and a connection point connecting a first terminal of the fifth transistor and a first terminal of the sixth transistor is the first terminal of the pull-down sub-circuit; and
wherein a second terminal of the fifth transistor is the second terminal of the pull-down sub-circuit, and a second terminal of the sixth transistor is the third terminal of the pull-down sub-circuit.

8. The shift register according to claim 4,
wherein the reset sub-circuit includes a seventh transistor and an eighth transistor;
wherein a connection point connecting a control terminal of the seventh transistor and a control terminal of the eighth transistor is the control terminal of the reset sub-circuit, and a connection point connecting a first terminal of the seventh transistor and a first terminal of the eighth transistor is the first terminal of the reset sub-circuit; and
wherein a second terminal of the seventh transistor is the second terminal of the reset sub-circuit, and a second terminal of the eighth transistor is the third terminal of the reset sub-circuit.

9. The shift register according to claim 3,
wherein the pull-up sub-circuit includes a second transistor and a first capacitor;
wherein a control terminal of the second transistor is the control terminal of the pull-up sub-circuit, a first terminal of the second transistor is the first terminal of the pull-up sub-circuit, and a second terminal of the second transistor is the second terminal of the pull-up sub-circuit; and
wherein the first capacitor is connected between the control terminal and the second terminal of the second transistor.

10. The shift register according to claim 9,
wherein the pull-down control sub-circuit includes a third transistor and a fourth transistor;
wherein a control terminal of the third transistor is the control terminal of the pull-down control sub-circuit, a first terminal of the third transistor is the first terminal of the pull-down control sub-circuit, and a second terminal of the third transistor is the third terminal of the pull-down control sub-circuit; and
wherein a connection point connecting a control terminal and a first terminal of the fourth transistor is the second terminal of the pull-down control sub-circuit, and a second terminal of the fourth transistor is connected to the second terminal of the third transistor.

11. The shift register according to claim 9,
wherein the pull-down sub-circuit includes a fifth transistor and a sixth transistor;
wherein a connection point connecting a control terminal of the fifth transistor and a control terminal of the sixth transistor is the control terminal of the pull-down sub-circuit, and a connection point connecting a first terminal of the fifth transistor and a first terminal of the sixth transistor is the first terminal of the pull-down sub-circuit; and
wherein a second terminal of the fifth transistor is the second terminal of the pull-down sub-circuit, and a second terminal of the sixth transistor is the third terminal of the pull-down sub-circuit.

12. The shift register according to claim 3,
wherein the pull-down control sub-circuit includes a third transistor and a fourth transistor;
wherein a control terminal of the third transistor is the control terminal of the pull-down control sub-circuit, a first terminal of the third transistor is the first terminal of the pull-down control sub-circuit, and a second terminal of the third transistor is the third terminal of the pull-down control sub-circuit; and
wherein a connection point connecting a control terminal and a first terminal of the fourth transistor is the second terminal of the pull-down control sub-circuit, and a second terminal of the fourth transistor is connected to the second terminal of the third transistor.

13. The shift register according to claim 12,
wherein the pull-down sub-circuit includes a fifth transistor and a sixth transistor;
wherein a connection point connecting a control terminal of the fifth transistor and a control terminal of the sixth transistor is the control terminal of the pull-down sub-circuit, and a connection point connecting a first terminal of the fifth transistor and a first terminal of the sixth transistor is the first terminal of the pull-down sub-circuit; and
wherein a second terminal of the fifth transistor is the second terminal of the pull-down sub-circuit, and a second terminal of the sixth transistor is the third terminal of the pull-down sub-circuit.

14. The shift register according to claim 3,
wherein the pull-down sub-circuit includes a fifth transistor and a sixth transistor;
wherein a connection point connecting a control terminal of the fifth transistor and a control terminal of the sixth transistor is the control terminal of the pull-down sub-circuit, and a connection point connecting a first terminal of the fifth transistor and a first terminal of the sixth transistor is the first terminal of the pull-down sub-circuit; and
wherein a second terminal of the fifth transistor is the second terminal of the pull-down sub-circuit, and a second terminal of the sixth transistor is the third terminal of the pull-down sub-circuit.

15. The shift register according to claim 3,
wherein the reset sub-circuit includes a seventh transistor and an eighth transistor;
wherein a connection point connecting a control terminal of the seventh transistor and a control terminal of the eighth transistor is the control terminal of the reset sub-circuit, and a connection point connecting a first terminal of the seventh transistor and a first terminal of the eighth transistor is the first terminal of the reset sub-circuit; and
wherein a second terminal of the seventh transistor is the second terminal of the reset sub-circuit, and a second terminal of the eighth transistor is the third terminal of the reset sub-circuit.

16. A driving method to drive the shift register according to claim 1, the method comprising: reversing a phase of the clock signal received by the reverse sub-circuit, and supplying the reversed phase signal to the pull-up sub-circuit.

17. A gate driving circuit comprising:
a plurality of first shift registers; and
a plurality of second shift registers;
wherein the first shift registers and the second shift registers are connected in cascade;
wherein the first shift register includes a pull-up control sub-circuit, a pull-up sub-circuit, a pull-down control sub-circuit, a pull-down sub-circuit, a reset sub-circuit and an output terminal, and the second shift register includes a pull-up control sub-circuit, a pull-up sub-circuit, a pull-down control sub-circuit, a pull-down sub-circuit, a reset sub-circuit, a reverse sub-circuit and an output terminal;
wherein the pull-up control sub-circuit is connected to the pull-up sub-circuit, and configured to control a pull-up of an electric level of the output terminal by the pull-up sub-circuit;
wherein the pull-up sub-circuit is connected to the output terminal, and configured to pull up the electric level of the output terminal;
wherein the pull-down control sub-circuit is connected to the pull-down sub-circuit, and configured to control a pull-down of the electric level of the output terminal by the pull-down sub-circuit;
wherein the pull-down sub-circuit is connected to the output terminal, and configured to pull down the electric level of the output terminal;
wherein the reset sub-circuit is connected to the output terminal, and configured to reset the electric level of the output terminal;
wherein the reverse sub-circuit includes a control terminal, a first terminal, a second terminal and a third terminal;
wherein the control terminal of the reverse sub-circuit is connected to a clock signal terminal, the first terminal of the reverse sub-circuit is connected to a first voltage terminal, the second terminal of the reverse sub-circuit is connected to a second voltage terminal, the third terminal of the reverse sub-circuit is connected to the pull-up sub-circuit; and a phase of a signal output to the pull-up sub-circuit by the third terminal of the reverse sub-circuit is opposite to a phase of a clock signal received from the clock signal terminal at the control terminal of the reverse sub-circuit;
wherein the output terminal is configured to supply a gate driving signal to a pixel circuit;
wherein the output terminal of one of the shift registers at one stage is connected to the pull-up control sub-circuit of one of the shift registers at a next stage, and the output terminal of one of the shift registers at another stage is connected to the reset sub-circuit of one of the shift registers at a previous stage; and
wherein the plurality of first shift registers and the plurality of second shift registers are supplied with the same clock signal.

18. An array substrate comprising the gate driving circuit according to claim 17.

19. A display device comprising the array substrate according to claim 18.

* * * * *